(12) United States Patent
Li

(10) Patent No.: US 9,477,127 B2
(45) Date of Patent: Oct. 25, 2016

(54) THIN FILM TRANSISTOR SUBSTRATE, MANUFACTURE METHOD THEREOF AND LIQUID CRYSTAL DISPLAY

(71) Applicant: SHENZHEN CHINA STAR OPTOELECTRONICS TECHNOLOGY CO., LTD, Shenzhen, Guangdong (CN)

(72) Inventor: Jinlei Li, Guangdong (CN)

(73) Assignee: SHENZHEN CHINA STAR OPTOELECTRONICS TECHNOLOGY CO., LTD (CN)

( * ) Notice: Subject to any disclaimer, the term of this patent is extended or adjusted under 35 U.S.C. 154(b) by 252 days.

(21) Appl. No.: 14/382,718

(22) PCT Filed: May 15, 2014

(86) PCT No.: PCT/CN2014/077528
§ 371 (c)(1),
(2) Date: Sep. 3, 2014

(87) PCT Pub. No.: WO2015/172343
PCT Pub. Date: Nov. 19, 2015

(65) Prior Publication Data
US 2016/0274392 A1   Sep. 22, 2016

(30) Foreign Application Priority Data
May 13, 2014   (CN) .......................... 2014 1 0201456

(51) Int. Cl.
*H01L 27/32* (2006.01)
*H01L 29/786* (2006.01)
(Continued)

(52) U.S. Cl.
CPC ....... *G02F 1/1368* (2013.01); *G02F 1/136213* (2013.01); *H01L 21/0217* (2013.01); *H01L 21/0262* (2013.01); *H01L 21/0274* (2013.01); *H01L 21/02271* (2013.01);
(Continued)

(58) Field of Classification Search
CPC .......... H01L 27/3272; H01L 27/3244; H01L 29/41733
USPC .............................. 257/59, 60, 72
See application file for complete search history.

(56) References Cited

U.S. PATENT DOCUMENTS

| 8,507,303 | B2 * | 8/2013 | Park ..................... H01L 27/124 257/E21.158 |
| 2008/0062340 | A1 | 3/2008 | Um et al. |
| 2011/0267554 | A1 | 11/2011 | Yang et al. |

FOREIGN PATENT DOCUMENTS

| CN | 101231434 A | 7/2008 |
| CN | 101236343 A | 8/2008 |

*Primary Examiner* — Cuong Q Nguyen
(74) *Attorney, Agent, or Firm* — Roger D. Emerson; Emerson Thomson Bennett, LLC

(57) ABSTRACT

The present invention provides a manufacture method of a thin film transistor substrate: forming a first metal layer, a first chemical vapor deposition layer, a second metal layer and a second chemical vapor deposition layer on a substrate; forming photoresistor on the second chemical vapor deposition layer; implementing exposure and development to the photoresistor; implementing via etching to a via area where the photoresistor on the second chemical vapor deposition layer is removed; implementing photoresistor ashing to remove the photoresistor in the area of the common capacitor; etching the silicon nitride layer; forming a pixel electrode layer. The present invention is capable of promoting video quality and saving the backlight power consumption.

15 Claims, 4 Drawing Sheets

(51) Int. Cl.
*G02F 1/1368* (2006.01)
*H01L 27/12* (2006.01)
*G02F 1/1362* (2006.01)
*H01L 21/027* (2006.01)
*H01L 21/311* (2006.01)
*H01L 21/02* (2006.01)
*H01L 21/3213* (2006.01)

(52) U.S. Cl.
CPC .. *H01L 21/02532* (2013.01); *H01L 21/02592* (2013.01); *H01L 21/31111* (2013.01); *H01L 21/32133* (2013.01); *H01L 27/124* (2013.01); *H01L 27/1222* (2013.01); *H01L 27/1255* (2013.01); *H01L 27/1262* (2013.01); *H01L 27/1288* (2013.01); *G02F 2001/136236* (2013.01)

THIN FILM TRANSISTOR SUBSTRATE, MANUFACTURE METHOD THEREOF AND LIQUID CRYSTAL DISPLAY

BACKGROUND OF THE INVENTION

1. Field of the Invention

The present invention generally relates to a manufacture method of a thin film transistor substrate, the thin film transistor substrate and a thin film transistor liquid crystal display.

2. Description of Prior Art

A large size TFT-LCD (Thin Film Transistor Liquid Crystal Display) has been widely used in the flat panel TV field. What is most significant and different from PC monitor and mobile phone screen, the wider view angle is much more required. Therefore, people can watch the TV images more clearly from any angles.

As regarding of VA (Vertical Alignment) panel, a traditional method of increasing the view angle is to divide one pixel into two sub pixels. Each sub pixel is arranged as 4 domain structure due to the different ITO directions of the pixel electrodes. The pixel electrode of one sub pixel is coupled to the charge-sharing common capacitor through a TFT switch. When the TFT switch is on, the charge of the sub pixel will partially flows to the charge-sharing common capacitor and leads to that the voltage of this sub pixel is slightly smaller than the voltage of the other sub pixel. Consequently, the brightnesses of these two sub pixels become different. Then, 8 domain structure can be obtained to increase the view angle of the images.

In general, the signal line metal electrode and the metal gate electrode are employed as capacitor electrode plates of the charge-sharing common capacitor. An isolation layer sandwiching an As layer is formed as a MIM (Metal injection Molding) structure. In the five-mask process, the active amorphous silicon layer and the active ohmic contact layer (P-doped silicon layer) of the As layer are both etched. Therefore, the only the silicon nitride isolation layer is sandwiched by the two metal electrode plates of the charge-sharing common capacitor. The capacitance of such capacitor does not vary when the positive and negative polarities of the metal plates are changed.

However, for magnifying productivity of TFT-LCD substrates to reduce the production cost, the five-mask process has been improved as four-mask process, i.e. the photolithography process and etching process are canceled and the formation of the second metal electrode layer is directly implemented after the gate electrode isolation layer and the active layer are formed by CVD (chemical vapor deposition). Then, with a half tone mask going with wet etching and dry etching processes, the signal electrode and TFT trench are formed. In the charge-sharing common capacitor of the four-mask process, a complete CVD film is sandwiched by the signal line metal electrode and the metal gate electrode. The CVD film comprises an isolation layer, an amorphous silicon layer and an ohmic contact layer. When the amorphous silicon layer, the ohmic contact layer and the isolation layer are sandwiched, the only distinction is the condition of the silicon nitride isolation layer. When the capacitance varies as positive and negative polarities of the two metal electrode plates are changed. The video quality and reliability descending due to the abnormalities of after-images, flickers and et cetera, which are caused by capacitance variation.

SUMMARY OF THE INVENTION

An objective of the present invention is to provide a manufacture method of a thin film transistor substrate, the thin film transistor substrate and a thin film transistor liquid crystal display for solving issues of video quality and reliability descending due to the abnormalities of afterimages, flickers and et cetera, which are caused by capacitance variation. The capacitance varies when positive and negative polarities of the two metal electrode plates are changed under circumstance that the common capacitor is formed by prior arts.

Here is how the present invention is achieved, a manufacture method of a thin film transistor substrate, and the manufacture method of the thin film transistor substrate comprising steps of:

providing a substrate to sequentially form a first metal layer, a first chemical vapor deposition layer, a second metal layer and a second chemical vapor deposition layer on a surface of the substrate;

wherein the first metal layer comprises a lower electrode of a common capacitor, and the first chemical vapor deposition layer and the second chemical vapor deposition layer respectively comprises a silicon nitride layer;

forming photoresistor on the second chemical vapor deposition layer;

implementing exposure and development to the photoresistor with a halftone mask, and a position corresponding to the halftone mask is an area of the common capacitor;

implementing via etching to a via area where the photoresistor on the second chemical vapor deposition layer is removed;

implementing photoresistor ashing to remove the photoresistor in the area of the common capacitor;

etching the silicon nitride layer in the area of the common capacitor;

stripping rest of the photoresistor;

forming a pixel electrode layer, wherein the pixel electrode layer comprises an upper electrode of the common capacitor.

Another objective of the present invention is to provide a manufacture method of a thin film transistor substrate, the manufacture method of the thin film transistor substrate comprising steps of:

providing a substrate to sequentially form a first metal layer, a first chemical vapor deposition layer, a second metal layer and a second chemical vapor deposition layer on a surface of the substrate;

wherein the first metal layer comprises a lower electrode of a common capacitor, and the first chemical vapor deposition layer and the second chemical vapor deposition layer respectively comprises a silicon nitride layer;

forming photoresistor on the second chemical vapor deposition layer;

implementing exposure and development to the photoresistor with a mask, and a position corresponding to the mask is an area of the common capacitor;

implementing via etching to a via area where the photoresistor on the second chemical vapor deposition layer is removed;

implementing photoresistor ashing to remove the photoresistor in the area of the common capacitor;

etching the silicon nitride layer in the area of the common capacitor;

forming a pixel electrode layer, wherein the pixel electrode layer comprises an upper electrode of the common capacitor.

Another objective of the present invention is to provide a thin film transistor substrate, the thin film transistor substrate comprising:

a substrate, being sequentially positioned with a first metal layer, a first chemical vapor deposition layer, a second metal layer and a second chemical vapor deposition layer on a surface of the substrate; wherein the first metal layer comprises a lower electrode of a common capacitor, and the first chemical vapor deposition layer and the second chemical vapor deposition layer respectively comprises a silicon nitride layer; the pixel electrode layer comprises an upper electrode of the common capacitor, and the upper electrode and the lower electrode of the common capacitor sandwiches the silicon nitride layer of the first chemical vapor deposition layer and the silicon nitride layer of the second chemical vapor deposition layer; alternatively, the upper electrode and the lower electrode of the common capacitor only sandwiches the silicon nitride layer of the first chemical vapor deposition layer.

Another objective of the present invention is to provide a thin film transistor liquid crystal display, comprising the aforesaid thin film transistor substrate.

In the present invention, the first metal layer and the pixel electrode layer are employed as two electrode plates of the common capacitor and the halftone mask is utilized in the photolithography process of the second chemical vapor deposition layer. On one hand, it is achievable to allow the medium sandwiched between the two electrode plates of the common capacitor to be only the silicon nitride layer. The capacitance of the common capacitor can be maintained when the polarities of the metal electrode plates are changed to promote the video quality and the reliability.

On the other hand, with the halftone mask utilized in the photolithography process of the second chemical vapor deposition layer, etching the isolation layer between the two metal electrode plates of the common capacitor also can be implemented beside the normal via etching. Accordingly, the thickness of the isolation layer between the two metal electrode plates of the common capacitor is possible to be decreased and the capacitance of the common capacitor can be increased. Under circumstance of remaining the same capacitance, the metal electrode plates can be smaller to increase the aperture ratio of the display panel. With the increased aperture ratio, the power of the backlight can be diminished for maintaining the same display brightness to save the power the backlight power consumption.

DETAILED DESCRIPTION OF THE INVENTION

To make the objects, technical solutions and advantages of the present invention will be more clearly understood, the accompanying drawings and the following embodiments of the present invention will be described in more detail. It should be understood that the specific embodiments described herein are merely to illustrate the invention and are not intended to limit the present invention.

In the present invention, the first metal layer and the pixel electrode layer are employed as two electrode plates of the charge-sharing common capacitor and the halftone mask photolithography process is utilized for the second chemical vapor deposition layer. On one hand, it is achievable to allow the medium sandwiched between the two electrode plates of the charge-sharing common capacitor to be only the silicon nitride layer. The capacitance of the charge-sharing common capacitor can be maintained when the polarities of the metal electrode plates are changed to promote the video quality and the reliability; on the other hand, the thickness of the isolation layer between the two metal electrode plates of the charge-sharing common capacitor is possible to be decreased and the capacitance of the charge-sharing common capacitor can be increased. Under circumstance of remaining the same capacitance, the metal electrode plates of the charge-sharing common capacitor can be smaller to increase the aperture ratio of the display panel.

Figure 1:
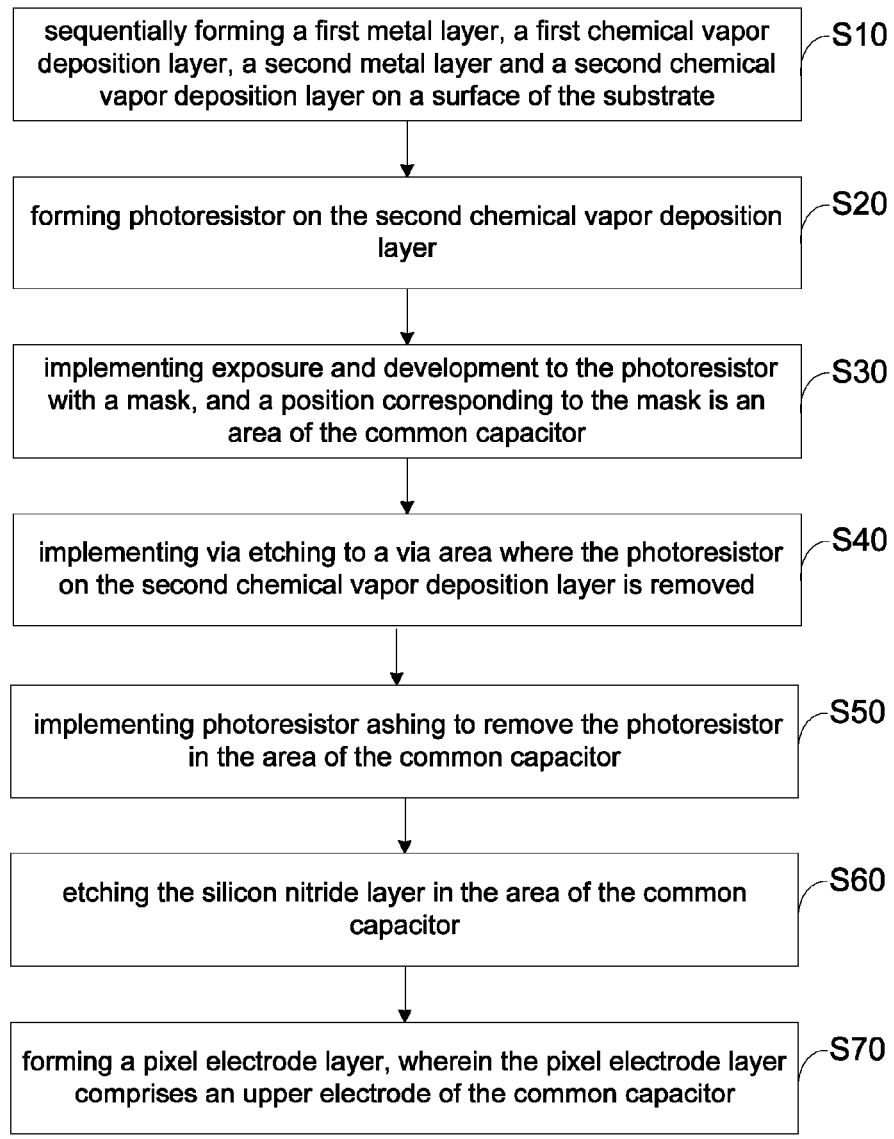
FIG. 1 depicts a flow chart of a manufacture method of a thin film transistor substrate according to the first embodiment of the present invention.

Please refer to FIG. 1, which depicts a flow chart of a manufacture method of a thin film transistor substrate according to the first embodiment of the present invention and the manufacture method comprises steps of:

In step S10, providing a substrate to sequentially form a first metal layer, a first chemical vapor deposition layer, a second metal layer and a second chemical vapor deposition layer on a surface of the substrate; wherein the first metal layer comprises a lower electrode of a common capacitor, and the first chemical vapor deposition layer and the second chemical vapor deposition layer respectively comprises a silicon nitride layer;

In the embodiment of the present invention, the step of forming the first chemical vapor deposition layer on the surface of the substrate comprises:

forming the silicon nitride layer, an amorphous silicon layer, an ohmic contact layer sequentially and forming a pattern of the first chemical vapor deposition layer.

In a preferable embodiment of the present invention, after the step of forming the first chemical vapor deposition layer on the surface, the manufacture method further comprises steps:

forming photoresistor on the first chemical vapor deposition layer;

implementing exposure and development to the photoresistor;

implementing etching to the area of the common capacitor where the photoresistor on the first chemical vapor deposition layer is removed to etch the amorphous silicon layer and the ohmic contact layer in an corresponding position of the area of the common capacitor;

etching the second metal layer in the corresponding position of the area of the common capacitor after forming the second metal layer on the surface of the substrate.

In step S20, forming photoresistor on the second chemical vapor deposition layer;

In step S30, implementing exposure and development to the photoresistor with a mask, and a position corresponding to the mask is an area of the common capacitor;

In the embodiment of the present invention, the mask is a halftone mask, and the position corresponding to the halftone mask is an area of the upper electrode of the common capacitor.

In step S40, implementing via etching to a via area where the photoresistor on the second chemical vapor deposition layer is removed;

In step S50, implementing photoresistor ashing to remove the photoresistor in the area of the common capacitor;

In the embodiment of the present invention, the step of implementing photoresistor ashing to remove the photoresistor in the area of the common capacitor comprises:

implementing photoresistor ashing by using oxygen in the dry etching gas to implement oxidation remove to the photoresistor;

adjusting seconds of ashing and stopping ashing when the photoresistor in the area of the common capacitor becomes ash and removed.

In Step S60, etching the silicon nitride layer in the area of the common capacitor;

As being a preferable embodiment of the present invention, the step of etching the silicon nitride layer in the area of the common capacitor comprises:

etching a part of the silicon nitride layer of the second chemical vapor deposition layer to sandwich the silicon nitride layer of the first chemical vapor deposition layer and the silicon nitride layer of the second chemical vapor deposition layer by the upper electrode and the lower electrode of the common capacitor.

As being another preferable embodiment of the present invention, the step of etching the silicon nitride layer in the area of the common capacitor comprises:

etching a whole of the silicon nitride layer of the second chemical vapor deposition layer to only sandwich the silicon nitride layer of the first chemical vapor deposition layer by the upper electrode and the lower electrode of the common capacitor.

In the embodiment of the present invention, after the step of etching the silicon nitride layer in the area of the common capacitor, the manufacture method further comprises:

stripping rest of the photoresistor.

In Step S70, forming a pixel electrode layer, wherein the pixel electrode layer comprises an upper electrode of the common capacitor.

Figure 2:
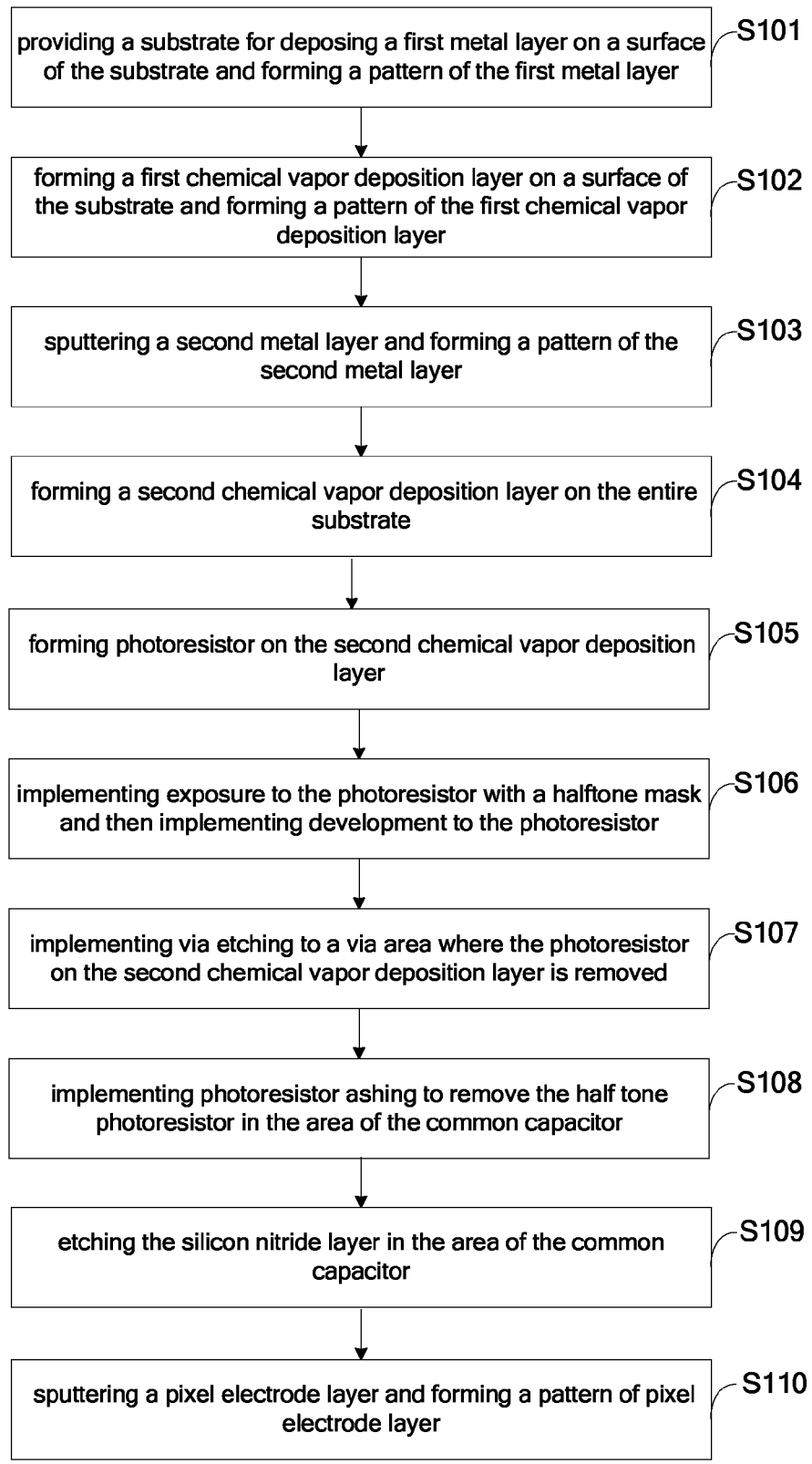
FIG. 2 depicts a flow chart of a manufacture method of a thin film transistor substrate according to the second embodiment of the present invention.

Please refer to FIG. 2, which depicts a flow chart of a manufacture method of a thin film transistor substrate according to the second embodiment of the present invention and the manufacture method comprises steps of:

In Step S101, providing a substrate for deposing a first metal layer on a surface of the substrate and forming a pattern of the first metal layer, wherein the pattern of the first metal layer comprises lower electrode of the common capacitor;

Preferably, the substrate can be a glass substrate.

In the embodiment of the present invention, the photolithography process and the etching process are employed to form the pattern of the first metal layer after the first metal layer is deposed on the surface of the substrate, wherein the pattern of the first metal layer comprises the gate electrode of the thin film transistor, the lower electrode of the common capacitor and the pad electrode of the connecting pad.

In Step S102, forming a first chemical vapor deposition layer on a surface of the substrate and forming a pattern of the first chemical vapor deposition layer, wherein the pattern of the first chemical vapor deposition layer comprises a silicon nitride layer;

In the embodiment of the present invention, the first chemical vapor deposition layer comprises the silicon nitride layer, an amorphous silicon layer and an ohmic contact layer. Specifically, the step S102 is: forming the silicon nitride layer, the amorphous silicon layer, the ohmic contact layer sequentially on the substrate and forming the pattern of the first chemical vapor deposition layer.

In the embodiment of the present invention, the silicon nitride layer, the amorphous silicon layer, the ohmic contact layer are sequentially formed on the substrate by chemical vapor deposition processes and then, the photolithography process and the etching process are employed to form the pattern of the first metal layer.

As being a preferable embodiment of the present invention, after the step of forming the first chemical vapor deposition layer on the surface, the manufacture method further comprises steps:

forming photoresistor on the first chemical vapor deposition layer;

implementing exposure and development to the photoresistor;

implementing etching to the area of the common capacitor where the photoresistor on the first chemical vapor deposition layer is removed to etch the amorphous silicon layer and the ohmic contact layer in a corresponding position of the area of the common capacitor.

In Step S103, sputtering a second metal layer and forming a pattern of the second metal layer;

In the embodiment of the present invention, the photolithography process and the etching process are employed to form the pattern of the second metal layer after the second metal layer is sputtered. The pattern of the second metal layer comprises a signal electrode.

As being a preferable embodiment of the present invention, the second metal layer in the corresponding position of the area of the common capacitor is etched after the second metal layer is formed.

In Step S104, forming a second chemical vapor deposition layer on the entire substrate;

In the embodiment of the present invention, the second chemical vapor deposition layer can be a silicon nitride layer.

In Step S105, forming photoresistor on the second chemical vapor deposition layer;

In Step S106, implementing exposure to the photoresistor with a halftone mask and then implementing development to the photoresistor;

In the embodiment of the present invention, the position corresponding to the halftone mask is an area where the two electrode plates of the common capacitor are opposite to each other. Specifically, the position corresponding to the halftone mask is an area of the upper electrode of the common capacitor.

In Step S107, implementing via etching to a via area where the photoresistor on the second chemical vapor deposition layer is removed;

In the embodiment of the present invention, a dry etching process is preferably considered for the via etching.

In Step S108, implementing photoresistor ashing to remove the half tone photoresistor in the area of the common capacitor;

Preferably, the photoresistor ashing is a dry etching process to remove the half tone photoresistor in the area of the common capacitor.

In the embodiment of the present invention, the thickness of the photoresistor can be 1.5 μm~2.2 μm. The photoresistor in the area where the two electrode plates of the charge-sharing common capacitor are opposite to each other becomes 0.3 μm~0.6 μm after the photoresistor in the via area is removed. The thickness of the photoresistor remains the same in other areas where is not exposed.

As being a preferable embodiment of the present invention, the step of implementing photoresistor ashing to remove the photoresistor in the area of the common capacitor comprises:

As implementing photoresistor ashing (using oxygen in the dry etching gas to implement oxidation removing to the photoresistor), seconds of ashing is adjusted and ashing is stopped when the photoresistor in the area of the common capacitor becomes ash and removed.

In Step S109, etching the silicon nitride layer in the area of the common capacitor;

In the embodiment of the present invention, a dry etching process is chosen for etching the silicon nitride layer in the area of the common capacitor. The thickness of SiNx in the area of the charge-sharing common capacitor can be 100-400 nm.

As being a preferable embodiment of the present invention, after step S109, the manufacture method further comprises:

stripping rest of the photoresistor.

In Step S110, sputtering a pixel electrode layer and forming a pattern of pixel electrode layer, wherein the pattern of pixel electrode layer comprises an upper electrode of the common capacitor.

In the embodiment of the present invention, the photolithography process and the etching process are employed to form the pattern of pixel electrode layer after the pixel electrode layer is sputtered.

The pixel electrode layer can be formed by Indium Tin Oxide (ITO) or Indium Zinc Oxide (IZO).

Figure 3:
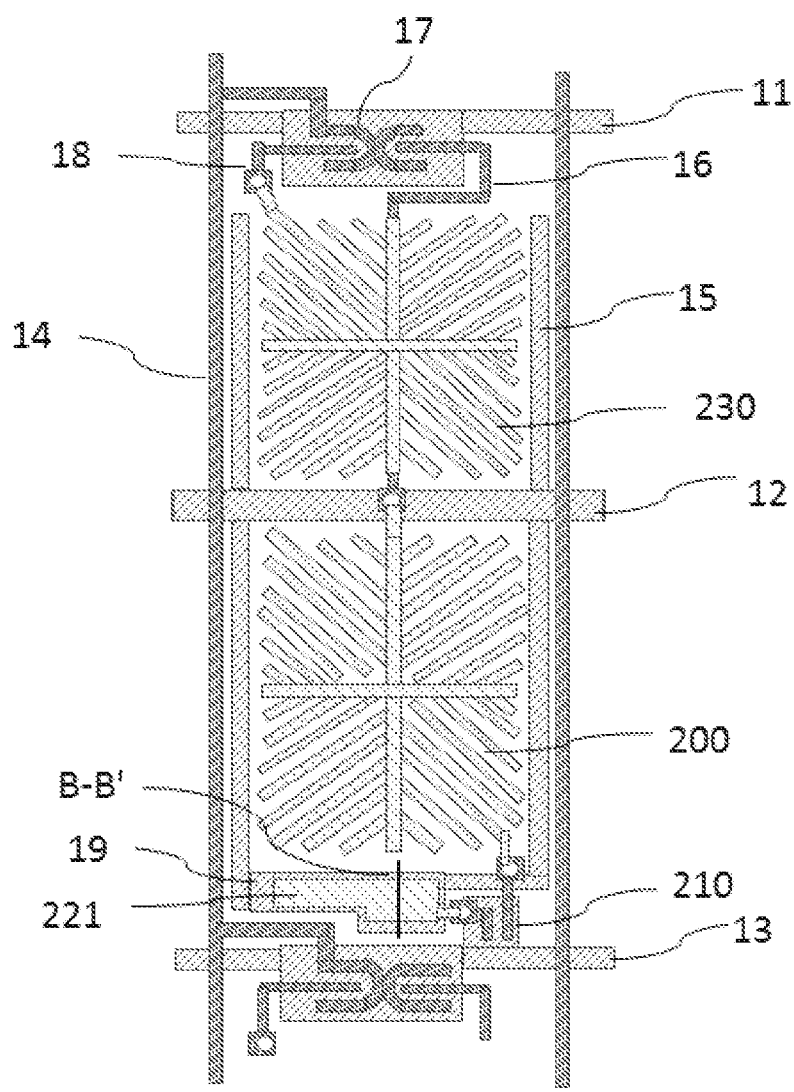
FIG. 3 shows a pixel structure diagram of charge sharing provided by the embodiments of the present invention.

According to the aforementioned manufacture method of the thin film transistor substrate, the derived pixel electrode structure of the common capacitor is shown in FIG. 3.

As shown in FIG. 3, the mark number 11 and the mark number 13 in FIG. 3 respectively are the nth scan line and the n+1th scan line. The mark numbers 12, 15, 19 are formed in the same photolithography process with the scan lines. The mark number 12 is a common capacitor. The mark number 15 is a shading line. The mark number 19 is the lower electrode of the charge-sharing common capacitor.

In FIG. 3, the mark number 14 is a signal line. The mark number 17 are two back to back TFT elements, respectively providing electronic signals to the main pixel and the sub pixel through the source 18 and drain 16. The mark number 230 is the ITO electrode of the main pixel. The mark number 200 is the ITO electrode of the sub pixel. The mark number 210 is the TFT of the charge-sharing common capacitor. The mark number 221 is the upper electrode of the charge-sharing common capacitor.

In the embodiment of the present invention, the aforesaid charge-sharing achieves the object of wide view angle by followings: the TFT elements 17 are on to write voltage signals of the signal line 11 into the main pixel 230 and sub pixel 200 when the scan line 11 provides an on-switching voltage. Then, The signal line 11 provides off-switching and the scan line 13 provides an on-switching voltage. At this moment, the TFT 210 of the common capacitor is on for sharing the charge into the common capacitor. Accordingly, the voltages of the main pixel and sub pixel will be different. With the Asterisk-shape electrode, the effect of the 8 domain can be realized and accordingly the effect of the wide view angle can be achievable. The effect of the 8 domain wide view angle is better than that of the 4 domain wide view angle.

Figure 4:
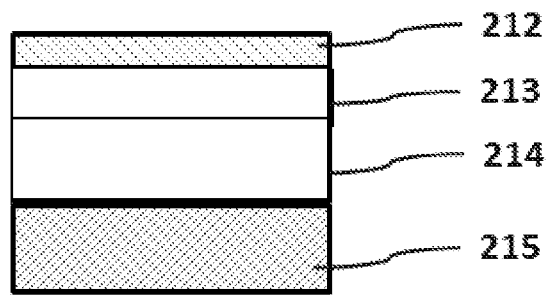
FIG. 4 shows a sectional view of B-B' line shown in FIG. 3.

The upper electrode 221 of the common capacitor is at the same layer of the ITO electrode layer and is connected to TFT 210 through vias. FIG. 4 is a sectional view of B-B' line shown in FIG. 3. The upper electrode 212 is ITO and at the same layer of the of the ITO pixel electrode layer; the lower electrode 215 of the common capacitor is belong to the first metal layer and at the same layer of the scan electrode layer. The second chemical vapor deposition layer comprises a silicon nitride layer; When a part of the silicon nitride layer of the second chemical vapor deposition layer is etched, the silicon nitride layer (the amorphous silicon layer and the P-doped amorphous silicon have already been etched) of the first chemical vapor deposition layer and the silicon nitride layer of the second chemical vapor deposition layer is sandwiched by the upper electrode and the lower electrode of the common capacitor. The thickness of the silicon nitride layer of the first chemical vapor deposition layer is about 300-400 nm. The thickness of the silicon nitride layer of the second chemical vapor deposition layer is about 200-250 nm; Then, the total thickness of the silicon nitride layer in the common capacitor is 500-650 nm. Although the capacitance does not vary when the positive and negative polarities of the two metal plates are changed, the distance between the metal plates is larger and the capacitance of the common capacitor is smaller.

The calculation formula of the plate capacitor is: $C=\epsilon\epsilon_0 * (S/d)$. $\epsilon$ is relative dielectric constant. $\epsilon_0$ is vacuum dielectric constant. S is the area of the parallel plate. d is the distance between the plates.

Accordingly, under circumstance of remaining the same capacitance but shrinking the plate area of the common capacitor and increasing the aperture ratio is exactly the elaborated content of the present invention.

The elaborated design of the common capacitor according to the present invention is as the same as FIG. 3 but merely some difference exist as regarding the manufacture processes. In one embodiment of the present invention, the photolithography process is implemented after the second chemical vapor deposition layer is coated. A halftone mask is employed for the photolithography. The area of the halftone mask is designed just right in the area of the upper electrode plate of the common capacitor and the normal via area remained to be fully exposed. Accordingly, the dry etching process after the photolithography is changed from one step dry etching process to three step dry etching process: via etching, halftone photoresistor ashing and etching the SiNx in the area of the common capacitor. By controlling the seconds of etching. The remained SiNx thickness in the area of the common capacitor can be ensured in 100-400 nm.

Figure 5:
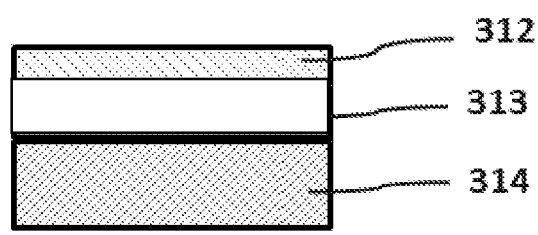
FIG. 5 shows a structure diagram of a thinner silicon nitride layer between the two electrodes of the common capacitor provided by the embodiments of the present invention.

By employing the manufacture processes provided by the embodiments of the present invention, the thickness between the two electrode plates of the common capacitor can be smaller as shown in FIG. 5. Once the distance in the common capacitor is decreased, the area of the two opposite of the common capacitor can be diminished. Then, the aperture ratio of the pixel can be increased and accordingly, the transmission rate of the display panel can be increased, too. The display panel can have better power saving property. In the meantime, only the single medium, SiNx is the medium in the common capacitor without amorphous silicon layer and P-doped amorphous silicon. The capacitance will not vary when the positive and negative polarities of the plates of the substrate are changed, and then, the reliability of the display panel is promoted and the defects, such as flickers and et cetera are eliminated.

The embodiment of the present invention also provides a thin film transistor substrate, and the thin film transistor substrate comprises:

a substrate, being sequentially positioned with a first metal layer, a first chemical vapor deposition layer, a second metal layer and a second chemical vapor deposition layer on a surface of the substrate; wherein the first metal layer comprises a lower electrode of a common capacitor, and the first chemical vapor deposition layer and the second chemical vapor deposition layer respectively comprises a silicon nitride layer; the pixel electrode layer comprises an upper electrode of the common capacitor, and the upper electrode and the lower electrode of the common capacitor sandwiches the silicon nitride layer of the first chemical vapor deposition layer and the silicon nitride layer of the second chemical vapor deposition layer; alternatively, the upper electrode and the lower electrode of the common capacitor only sandwiches the silicon nitride layer of the first chemical vapor deposition layer.

As being an embodiment of the present invention, when a part of the silicon nitride layer of the second chemical vapor deposition layer is etched, the silicon nitride layer of the first chemical vapor deposition layer and the silicon nitride layer of the second chemical vapor deposition layer is sandwiched by the upper electrode and the lower electrode of the common capacitor. Consequently, the total thickness of the silicon nitride in the common capacitor can be 500-650 nm.

As being an embodiment of the present invention, when a whole of the silicon nitride layer of the second chemical vapor deposition layer is etched, only the silicon nitride layer of the first chemical vapor deposition layer is sandwiched by the upper electrode and the lower electrode of the common capacitor. Consequently, the total thickness of the silicon nitride in the common capacitor can be 100-400 nm.

The embodiment of the present invention also provides a thin film transistor liquid crystal display, comprising the aforementioned thin film transistor substrate. Nevertheless, it is understandable that the thin film transistor liquid crystal display can be a TFT-LCD.

In conclusion, in the embodiments of the present invention, the first metal layer and the pixel electrode layer are employed as two electrode plates of the common capacitor and the halftone mask is utilized in the photolithography process of the second chemical vapor deposition layer. On one hand, it is achievable to allow the medium sandwiched between the two electrode plates of the common capacitor to be only the silicon nitride layer. The capacitance of the common capacitor can be maintained when the polarities of the metal electrode plates are changed to promote the video quality and the reliability.

On the other hand, with the halftone mask utilized in the photolithography process of the second chemical vapor deposition layer, etching the isolation layer between the two metal electrode plates of the common capacitor also can be implemented beside the normal via etching. Accordingly, the thickness of the isolation layer between the two metal electrode plates of the common capacitor is possible to be decreased and the capacitance of the common capacitor can be increased. Under circumstance of remaining the same capacitance, the metal electrode plates can be smaller to increase the aperture ratio of the display panel. With the increased aperture ratio, the power of the backlight can be diminished for maintaining the same display brightness to save the power the backlight power consumption.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A manufacture method of a thin film transistor substrate, the manufacture method of the thin film transistor substrate comprising steps of:
   providing a substrate to sequentially form a first metal layer, a first chemical vapor deposition layer, a second metal layer and a second chemical vapor deposition layer on a surface of the substrate;
   wherein the first metal layer comprises a lower electrode of a common capacitor, and the first chemical vapor deposition layer and the second chemical vapor deposition layer respectively comprises a silicon nitride layer;
   forming photoresistor on the second chemical vapor deposition layer;
   implementing exposure and development to the photoresistor with a halftone mask, and a position corresponding to the halftone mask is an area of the common capacitor;
   implementing via etching to a via area where the photoresistor on the second chemical vapor deposition layer is removed;
   implementing photoresistor ashing to remove the photoresistor in the area of the common capacitor;
   etching the silicon nitride layer in the area of the common capacitor;
   stripping rest of the photoresistor;
   forming a pixel electrode layer, wherein the pixel electrode layer comprises an upper electrode of the common capacitor.

2. The manufacture method of the thin film transistor substrate according to claim 1, wherein the position corresponding to the halftone mask is an area of the upper electrode of the common capacitor.

3. The manufacture method of the thin film transistor substrate according to claim 1, wherein the step of forming the first chemical vapor deposition layer on the surface of the substrate comprises:
   forming the silicon nitride layer, an amorphous silicon layer, an ohmic contact layer sequentially and forming a pattern of the first chemical vapor deposition layer.

4. The manufacture method of the thin film transistor substrate according to claim 3, wherein after the step of forming the first chemical vapor deposition layer on the surface, the manufacture method further comprises steps:
   forming photoresistor on the first chemical vapor deposition layer;
   implementing exposure and development to the photoresistor;
   implementing etching to the area of the common capacitor where the photoresistor on the first chemical vapor deposition layer is removed to etch the amorphous silicon layer and the ohmic contact layer in an corresponding position of the area of the common capacitor;
   etching the second metal layer in the corresponding position of the area of the common capacitor after forming the second metal layer on the surface of the substrate.

5. The manufacture method of the thin film transistor substrate according to claim 4, wherein the step of etching the silicon nitride layer in the area of the common capacitor further comprises:
   etching a part of the silicon nitride layer of the second chemical vapor deposition layer to sandwich the silicon nitride layer of the first chemical vapor deposition layer and the silicon nitride layer of the second chemical vapor deposition layer by the upper electrode and the lower electrode of the common capacitor.

6. The manufacture method of the thin film transistor substrate according to claim 4, wherein the step of etching the silicon nitride layer in the area of the common capacitor further comprises:

etching a whole of the silicon nitride layer of the second chemical vapor deposition layer to only sandwich the silicon nitride layer of the first chemical vapor deposition layer by the upper electrode and the lower electrode of the common capacitor.

7. The manufacture method of the thin film transistor substrate according to claim 5, wherein a total thickness of the silicon nitride layer in the common capacitor is 500-650 nm.

8. The manufacture method of the thin film transistor substrate according to claim 6, wherein a total thickness of the silicon nitride layer in the common capacitor is 100-400 nm.

9. A manufacture method of a thin film transistor substrate, the manufacture method of the thin film transistor substrate comprising steps of:

providing a substrate to sequentially form a first metal layer, a first chemical vapor deposition layer, a second metal layer and a second chemical vapor deposition layer on a surface of the substrate;

wherein the first metal layer comprises a lower electrode of a common capacitor, and the first chemical vapor deposition layer and the second chemical vapor deposition layer respectively comprises a silicon nitride layer;

forming photoresistor on the second chemical vapor deposition layer;

implementing exposure and development to the photoresistor with a mask, and a position corresponding to the mask is an area of the common capacitor;

implementing via etching to a via area where the photoresistor on the second chemical vapor deposition layer is removed;

implementing photoresistor ashing to remove the photoresistor in the area of the common capacitor;

etching the silicon nitride layer in the area of the common capacitor;

forming a pixel electrode layer, wherein the pixel electrode layer comprises an upper electrode of the common capacitor.

10. The manufacture method of the thin film transistor substrate according to claim 9, wherein the mask is a halftone mask, and the position corresponding to the halftone mask is an area of the upper electrode of the common capacitor.

11. The manufacture method of the thin film transistor substrate according to claim 9, wherein the step of forming the first chemical vapor deposition layer on the surface of the substrate comprises:

forming the silicon nitride layer, an amorphous silicon layer, an ohmic contact layer sequentially and forming a pattern of the first chemical vapor deposition layer.

12. The manufacture method of the thin film transistor substrate according to claim 11, wherein after the step of forming the first chemical vapor deposition layer on the surface, the manufacture method further comprises steps:

forming photoresistor on the first chemical vapor deposition layer;

implementing exposure and development to the photoresistor;

implementing etching to the area of the common capacitor where the photoresistor on the first chemical vapor deposition layer is removed to etch the amorphous silicon layer and the ohmic contact layer in an corresponding position of the area of the common capacitor;

etching the second metal layer in the corresponding position of the area of the common capacitor after forming the second metal layer on the surface of the substrate.

13. The manufacture method of the thin film transistor substrate according to claim 12, wherein the step of etching the silicon nitride layer in the area of the common capacitor further comprises:

etching a part of the silicon nitride layer of the second chemical vapor deposition layer to sandwich the silicon nitride layer of the first chemical vapor deposition layer and the silicon nitride layer of the second chemical vapor deposition layer by the upper electrode and the lower electrode of the common capacitor.

14. The manufacture method of the thin film transistor substrate according to claim 12, wherein the step of etching the silicon nitride layer in the area of the common capacitor further comprises:

etching a whole of the silicon nitride layer of the second chemical vapor deposition layer to only sandwich the silicon nitride layer of the first chemical vapor deposition layer by the upper electrode and the lower electrode of the common capacitor.

15. The manufacture method of the thin film transistor substrate according to claim 9, wherein after the step of etching the silicon nitride layer in the area of the common capacitor, the manufacture method further comprises:

stripping rest of the photoresistor.

* * * * *